(12) United States Patent
Kikutake et al.

(10) Patent No.: US 7,325,173 B2
(45) Date of Patent: Jan. 29, 2008

(54) SEMICONDUCTOR MEMORY HAVING ERROR CORRECTION

(75) Inventors: Akira Kikutake, Kawasaki (JP); Masato Matsumiya, Kawasaki (JP); Yasuhiro Onishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 392 days.

(21) Appl. No.: 11/092,768

(22) Filed: Mar. 30, 2005

(65) Prior Publication Data

US 2006/0156213 A1    Jul. 13, 2006

(30) Foreign Application Priority Data

Dec. 17, 2004   (JP) ............................. 2004-366027

(51) Int. Cl.
*G06F 11/00*    (2006.01)
(52) U.S. Cl. .................. 714/703; 714/746; 714/718; 714/25; 714/30; 714/734; 365/201
(58) Field of Classification Search ................. 714/703
See application file for complete search history.

(56) References Cited

U.S. PATENT DOCUMENTS 4,878,220 A * 10/1989 Hashimoto ................. 714/703
5,557,574 A * 9/1996 Senoo et al. ................ 365/201
6,009,026 A * 12/1999 Tamlyn et al. .............. 365/201
6,163,863 A * 12/2000 Schicht ....................... 714/718
6,314,538 B1 * 11/2001 Ochoa et al. ............... 714/724
6,418,072 B2 * 7/2002 Nakaya et al. .............. 365/201
7,013,413 B1 * 3/2006 Kim et al. ................... 714/719
2003/0106010 A1 * 6/2003 Fujioka et al. .............. 714/763
2003/0204795 A1 * 10/2003 Adams et al. ............... 714/718

FOREIGN PATENT DOCUMENTS

JP        2001-210099 A    8/2001
JP        2004-5951 A      1/2004

* cited by examiner

Primary Examiner—Guy Lamarre
Assistant Examiner—John P Trimmings
(74) Attorney, Agent, or Firm—Arent Fox LLP.

(57) ABSTRACT

During a first data compression test mode which disables an error correction function, first test data are written to a first regular memory block. Second test data are written to not only a second regular memory block, but a parity memory block. By changing the number of bits distributed to the first and second test data (compression rate of data), a data compression test for a parity memory block can be performed without need to increase the number of test terminals. As a result, the test time can be decreased and the test cost can be decreased.

7 Claims, 11 Drawing Sheets

SEMICONDUCTOR MEMORY HAVING ERROR CORRECTION

CROSS-REFERENCE TO RELATED APPLICATIONS

This application is based upon and claims the benefit of priority from Japanese Patent Application No. 2004-366027, filed on Dec. 17, 2004, the entire contents of which are incorporated herein by reference.

BACKGROUND OF THE INVENTION

1. Field of the Invention

The present invention relates to a semiconductor memory having an error correction function.

2. Description of the Related Art

A semiconductor memory that can enable or disable a function that corrects an error of data that are read from a memory cell has been proposed (for example, in Japanese Unexamined Patent Application Publication No. 2004-005951). This semiconductor memory also has an output compression circuit that determines whether the number of bit errors can be corrected by the error correction circuit.

On the other hand, so-called data compression test technology that writes data received from one data terminal (test terminal) to not only a memory cell corresponding to the data terminal, but memory cells corresponding to other data terminal has been proposed (for example, in Japanese Unexamined Patent Application Publication No. 2001-210099). In the data compression test, a defect of a semiconductor memory is detected when data of a plurality of bits that are read from memory cells are not coincident. When a data compression test is performed, the number of semiconductor memories mounted on a test evaluation board increases and the test cost decreases.

A usual semiconductor memory having an error correction circuit does not have a data compression test function, which decreases the number of data terminals necessary for testing the memory. Normally, when a memory area to be tested increases in a data compression test, data terminals from and to which compression data are read and written are required. Thus, the number of terminals for data to test the semiconductor memory increases, whereas the number of semiconductor memories that can be mounted on a test evaluation board decreases. Since the number of semiconductor memories that can be tested at a time decreases, the test time per memory increases and the test cost thereof increases.

SUMMARY OF THE INVENTION

An object of the present invention is to add a data compression test function to a semiconductor memory having an error correction function so as to decrease the test time and test cost.

In addition, an object of the present invention is to allow a constant number of semiconductor memories having both the error correction function and the data compression test function to be mounted on a test evaluation board to be kept constant regardless of a test mode.

According to an aspect of the present invention, a first distribution unit outputs first test data supplied to a first data terminal as common write data to a first regular memory block. A second distribution unit outputs second test data supplied to a second data terminal as common write data to a second regular memory block and a parity memory block. A parity operational unit generates parity data of a plurality of bits corresponding to write data. A data restoration unit corrects an error of data of a plurality of bits which are read from the first and second regular memory blocks with parity data of a plurality of bits which are read from the parity memory block and outputs the resultant data as correction data of a plurality of bits. A first coincidence detection unit detects coincidence/dissidence of data of a plurality of bits which are read from the first regular memory block. A second coincidence detection unit detects coincidence/dissidence of data of a plurality of bits which are read from the second regular memory block and the parity memory block. A test control unit enables or disables functions of those elements.

The first test data and the second test data are written to the first regular memory block, the second regular memory block, and the parity memory block during a first data compression test mode that disables an error correction function. The second test data are written to not only the second regular memory block, but the parity memory block. Since the number of bits (data compression rate) to which the first test data and second test data are distributed is varied, a data compression test for the parity memory block can be performed without need to increase the number of test terminals. Since the number of terminals does not increase, the number of semiconductor memories mounted on a test evaluation board can be prevented from decreasing. As a result, the test time for the semiconductor memory can be decreased and the test cost thereof can be decreased.

The first test data and second test data are written to the first and second regular memory blocks, respectively, during a second data compression test mode that enables the error correction function. In addition, parity data for the first and second test data are written to the parity memory block. The first and second test data that are read from the first and second regular memory blocks are error-corrected. Thereafter, coincidence/dissidence of each of the test data is detected. Thus, even if the first and second regular memory blocks have a bit error or the like, the error correction function can correct the bit error. In other words, when the second data compression test is performed, the yield of the semiconductor memory can be improved. Thus, since the first data compression test or the second data compression test is selected depending on the use condition, shipment condition, and so forth of the semiconductor memory, it can be optimally tested.

The first and second data compression tests can be performed with only the first and second data terminals. In other words, in the first and second data compression tests, the number of semiconductor memories that can be tested at a time can be kept constant. Thus, the first and second data compression tests can be performed with a common test evaluation board. As a result, the test cost of the semiconductor memory can be decreased.

According to a preferred example of the aspect of the present invention, the first and second distribution circuits are enabled and disabled, respectively, during the second data compression test mode. The second test data are output to only the second regular memory block, not the parity memory block. Since the second distribution unit is composed of the first and second distribution circuits, the destination of the second test data can be easily and securely selected corresponding to a test mode. In particular, the parity memory block stores either the second test data or the parity data depending on a test mode. Since an output of the second test data to the parity memory block can be enabled or disabled by controlling only the second distribution circuit, during the second data compression test mode, the second test data and the parity data can be securely prevented from colliding with each other.

According to a preferred example of the aspect of the present invention, a first coincidence detection circuit detects coincidence/dissidence of data of a plurality of bits which are read from the second regular memory block. A second coincidence detection circuit detects coincidence/dissidence of parity data of a plurality of bits which are read from the parity memory block. A third coincidence detection circuit detects coincidence/dissidence of data which are read from the second regular memory block and parity data which are read from the parity memory block in accordance with detection results of the first and second coincidence detection circuits. Thus, since coincidence/dissidence of data is detected for each memory block, the first to third coincidence detection circuits can be simply configured.

According to a preferred example of the aspect of the present invention, the bit width of data which are read from and written to the first and second regular memory blocks is the same as that of the parity memory block. Thus, the circuit structures of the first and second coincidence detection circuits and the first coincidence detection unit can become the same. As a result, the circuit design of the semiconductor memory can be easily performed.

According to a preferred example of the aspect of the present invention, in the first data compression test, data that are read from the first and second regular memory blocks are supplied to the first and second coincidence detection units as they are. In the second data compression test, data that are error-corrected by the data restoration unit are supplied to the first and second coincident detection unit. Since the data restoration unit has a transfer circuit, during the first and second data compression tests, the transfer path of data that are read from the first and second regular memory blocks can become the same. As a result, the number of wires formed in the semiconductor memory can be decreased and the chip size thereof can be decreased.

According to a preferred example of the aspect of the present invention, data output units select detection results which are output from the first and second coincidence detection units and output the selection results to the first or second data terminals during the first and second data compression test modes. The data output units select correction data which are output from the data restoration unit and output the selection data to the first or second data terminals, respectively, during a normal operation mode. The selections are performed by a selection circuit disposed in the data output units. Since data that are output to the data terminals are selected by the selection circuit, the first and second coincidence detection circuits can always operate in any one of the test modes and the normal operation mode. In other words, the functions of the first and second coincidence detection units can be enabled or disabled by the selection circuit. Since the first and second coincidence detection units do not need to be controlled corresponding to their operation modes, the first and second coincidence detection units can be simply configured.

According to a preferred example of the aspect of the present invention, the test control unit disables functions of the first and second distribution units and the first and second coincidence detection units and enables functions of the parity operational unit and the data restoration unit during a normal operation mode. Thus, the error correction function can be enabled during the normal operation mode. As a result, an error that occurs in the memory that is operating can be corrected.

BRIEF DESCRIPTION OF DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Next, with reference to the accompanying drawings, an embodiment of the present invention will be described. In the drawings, double square marks indicate external data terminals (pads). In the drawings, a solid signal line is composed of a plurality of lines. A part of a block to which a solid line is connected is composed of a plurality of circuits. A signal supplied through an external terminal is identified with the same symbol as the terminal name. A signal line that transmits a signal is identified with the same symbol as the signal name.

Figure 1:
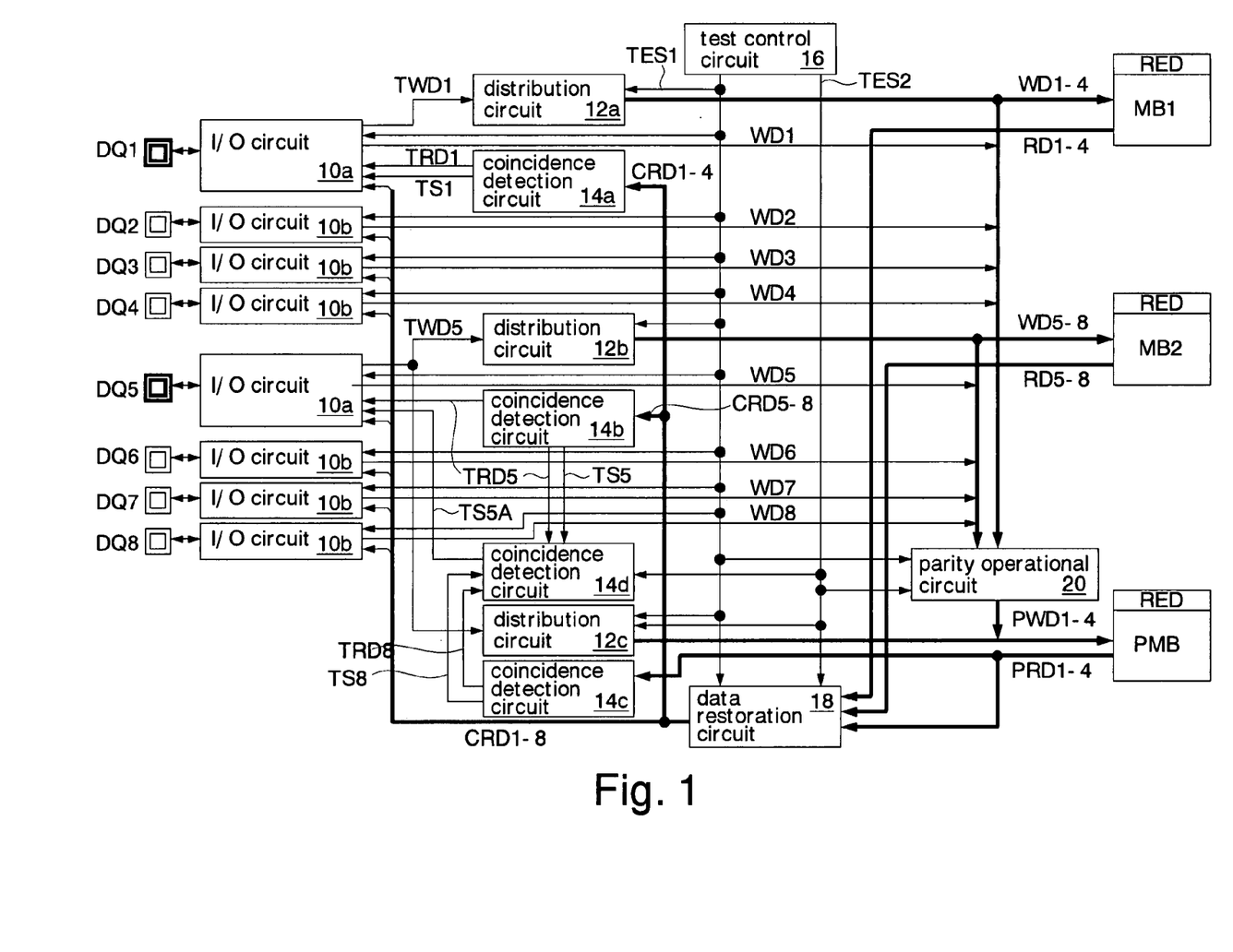
FIG. 1 is a block diagram showing a semiconductor memory according to a first embodiment of the present invention.

FIG. 1 shows a semiconductor memory according to a first embodiment of the present invention. The semiconductor memory is composed as a pseudo SRAM that is produced on a silicon substrate by the CMOS process. The pseudo SRAM has a memory core of a DRAM and an interface of an SRAM.

The pseudo SRAM has I/O circuits 10a and 10b, distribution circuits 12a, 12b, and 12c, coincidence detection circuits 14a, 14b, 14c, and 14d, a test control circuit 16 (test control unit), a data restoration circuit 18 (data restoration unit), a parity operational circuit 20 (parity operational unit), a first regular memory block MB1, a second regular memory block MB2, and a parity memory block PMB. The I/O circuits 10a and 10b are connected to data terminals DQ1-8. The regular memory blocks MB1 and MB2 and the parity memory block PMB each have a redundancy circuit RED that corrects an error.

Besides these circuit shown in the drawing, the pseudo SRAM also has an address buffer, an address decoder, a command buffer, a command decoder, an operation control circuit, and so forth. The address buffer receives an address signal with which a memory cell is selected. The command buffer receives operation commands (write command, read command, and so forth). The command decoder decodes operations commands. The operation control circuit generate control signals with which a write operation, a read operation, and a refresh operation for the memory blocks MB1, MB2, and MB3 are controlled.

External data terminals DQ1 and DQ5 indicated by solid square marks in the drawing are used for first and second data compression tests that will be described later. The other external terminals DQ2-4 and 6-8 are not used during the first and second data compression tests. The first data compression test is a data compression test that is executed while the error correction function is disabled. The second data compression test is a data compression test that is executed while the error correction function is enabled. In the first data compression test, compression data (common data) are written to the regular memory blocks MB1-2 and the parity memory block PMB. In the second data compression test, compression data are written to the regular memory blocks MB1-2 and parity bits of the compression data are written to the parity memory block PMB.

When the test control circuit 16 executes the first data compression test, the test control circuit 16 sets a test signal TES1 to a high level and a test signal TES2 to a low level (first data compression test mode). When the test control circuit 16 executes the second data compression test, the test control circuit 16 sets the test signals TES1 and TES2 to the high level (second data compression test mode). During the normal operation mode, the test control circuit 16 sets the test signals TES1 and TES2 to the low level. In other words, when the signal level of the test signal TES1 is low, the pseudo SRAM is set to the normal operation mode regardless of the level of the test signal TES2. When the signal level of the test signal TES1 changes to the high level, the pseudo SRAM switches from the normal operation mode to the test mode.

According to this embodiment, the normal operation mode is an operation mode that reads and writes data from and to the first and second regular memory blocks MB1-2 using the data terminals DQ1-8. The test mode is one of the first and second compression test modes that depend on the level of the test signal TES2. When the test control circuit 16 receives a test command from the command terminal, the test control circuit 16 changes the levels of the test signals TES1 and TES2 to predetermined levels to switch the pseudo SRAM from the normal operation mode to the test mode. Alternatively, when the test control circuit 16 receives a predetermined voltage from a dedicated test terminal pre-formed on the chip, the test control circuit 16 switches the pseudo SRAM from the normal operation mode to the test mode.

The distribution circuit 12a (first distribution unit) outputs test write data TWD1 (first test data) received from the data terminal DQ1 (first data terminal) as common write data WD1-4 corresponding to the data terminals DQ1-4 (first data terminal group) during the first and second data compression test modes. The distribution circuit 12b (first distribution circuit) outputs test write data TWD5 (second test data) received from the data terminal DQ5 (second data terminal) as common write data WD5-8 corresponding to the data terminals DQ5-8 (second data terminal group) during the first and second data compression test modes. The distribution circuit 12c (second distribution circuit) outputs test write data TWD5 as common parity data PWD1-4 during the first data compression test mode. The distribution circuits 12b and 12c function as a second distribution unit that outputs the test write data TWD5 supplied to the data terminal DQ5 as common write data to the second regular memory block MB2 and the parity memory block PMB.

The coincidence detection circuit 14a (first coincidence detection unit) outputs a test result signal TS1 depending on whether four-bit correction data CRD1-4 are coincident/dissident. In addition, the coincidence detection circuit 14a outputs correction data CRD1 as test result data TRD1. The coincidence detection circuit 14b (first coincidence detection circuit) outputs a test result signal TS5 depending on whether four-bit correction data CRD5-8 are coincident/dissident. In addition, the coincidence detection circuit 14b outputs correction data CRD5 as test result data TRD5. The coincidence detection circuit 14c (second coincidence detection circuit) outputs a test result signal TS8 depending on whether four-bit parity read data PRD1-4 that are read from the parity memory block PMB are coincident/dissident. In addition, the coincidence detection circuit 14c outputs parity read data PRD1 as test result data TRD8. The coincidence detection circuit 14d (third coincidence detection circuit) outputs a test result signal TS5A corresponding to the test result data TRD5 and TRD8 and the test result signals TS5 and TS8. Thus, the coincidence detection circuits 14b, 14c, and 14d are hierarchically configured. The coincidence detection circuits 14b, 14c, and 14d function as a second coincidence detection unit that detects whether data RD5-8 and PRD1-4 that are read from the second regular memory block MB2 and the parity memory block PMB are coincident/dissident.

One coincidence detection circuit does not detect whether the correction data CRD5-8 and the parity read data PRD1-4 are coincident/dissident at a time. Instead, the coincidence detection circuits 14b and 14c detect four bits each. The coincidence detection circuit 14d combines the detected results. Thus, the coincidence detection circuits 14a, 14b, and 14c can be configured with the same circuits shown in FIG. 3 (that will be described later). As a result, the circuit design time of the pseudo SRAM can be decreased. In addition, since the number of circuits that perform the design verification for the pseudo SRAM is decreased, the design verification time can be decreased.

The data restoration circuit 18 corrects an error of the read data RD1-8 corresponding to the parity read data PRD1-4 during the normal operation mode and the second data compression test mode and outputs the corrected data as correction data CRD1-8. The data restoration circuit 18 outputs the read data RD1-8 as correction data CRD1-8 regardless of the parity read data PRD1-4 during the first data compression test. The parity operational circuit 20 generates four-bit parity data PWD1-4 with the write data WD1-8 during the normal operation mode and the second data compression test mode. The parity operational circuit 20 is deactivated during the first data compression test mode. Thus, the parity operational circuit 20 stops generating parity.

The data bit width of each of the regular memory blocks MB1-2 and the parity memory block PMB is four bits. The regular memory blocks MB1-2 and the parity memory block PMB are configured with the same circuit and the same layout. The memory blocks MB1-2 and PMB have dynamic memory cells like regular DRAMs. Each of dynamic memory cells has a capacitor that stores data as an electric charge and a transfer transistor that connects the capacitor to a bit line.

Figure 2:
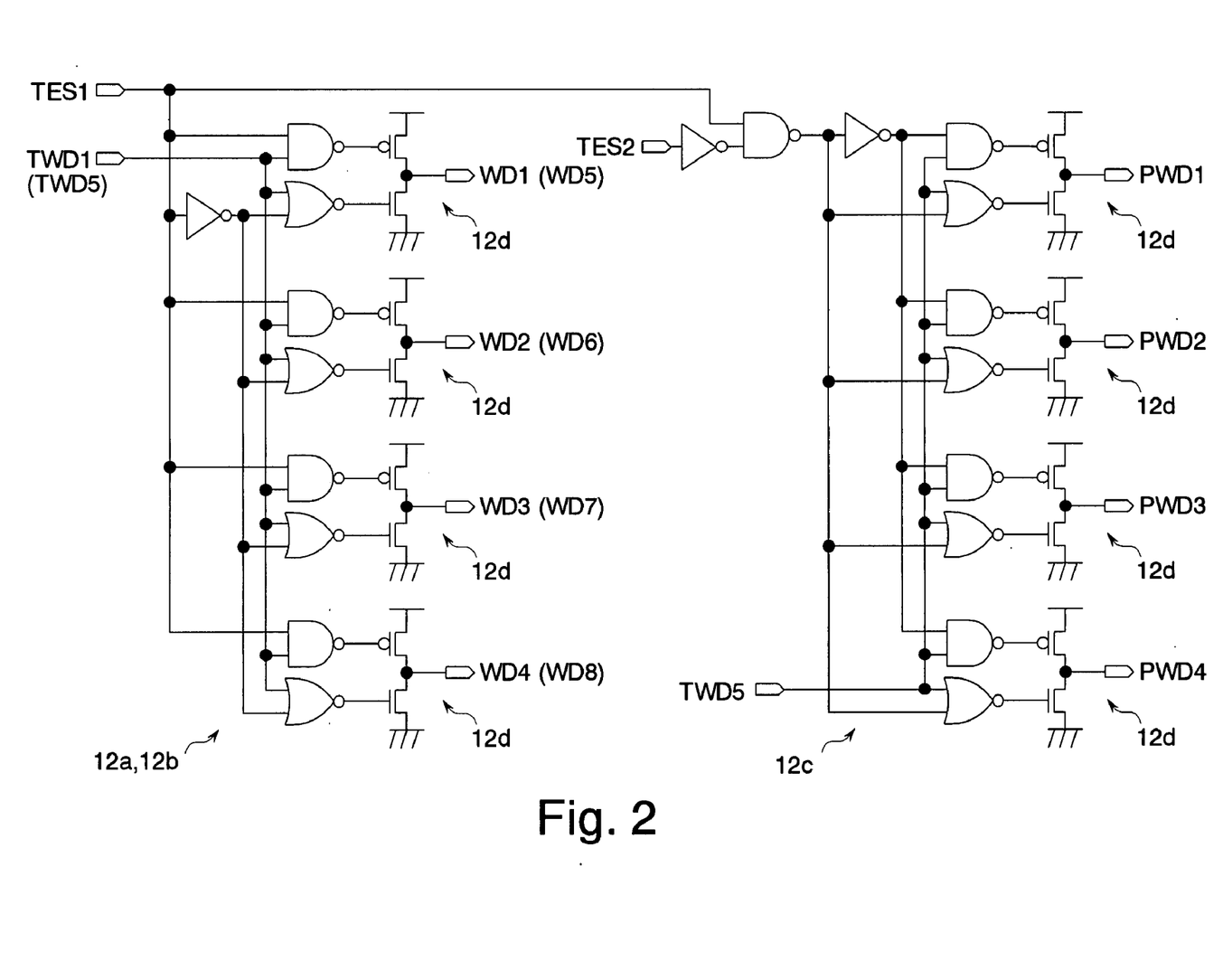
FIG. 2 is a circuit diagram showing details of distribution circuits shown in FIG. 1.

FIG. 2 shows details of the distribution circuits 12a, 12b, and 12c shown in FIG. 1. Each of the distribution circuits 12a, 12b, and 12c has four output units 12d that are connected to write data lines WD1-8 and parity write data lines PWD1-4. Each of the output units 12*d* is composed of a tri-state buffer circuit and a logic gate that controls the tri-state buffer. The output units 12*d* of the distribution circuit 12*a* (or 12*b*) output the test write data TWD1 (or TWD5) as common write data WD1-4 (or WD5-8) during the first and second data compression test modes (TES1=high level). The output units 12*d* of the distribution circuit 12*a* (or 12*b*) set output nodes of the tri-state buffers to a high impedance state during the normal operation mode (TES1=low level). The output units 12*d* of the distribution circuit 12*c* output the test write data TWD5 as common parity write data PWD1-4 during the first data compression test mode (TES1=high level, TES2=low level). The output units 12*d* of the distribution circuit 12*c* set the output nodes of the tri-state buffers to the high impedance state during the normal operation mode (TES1=low level) and the second data compression test mode (TES2=high level).

Figure 3:
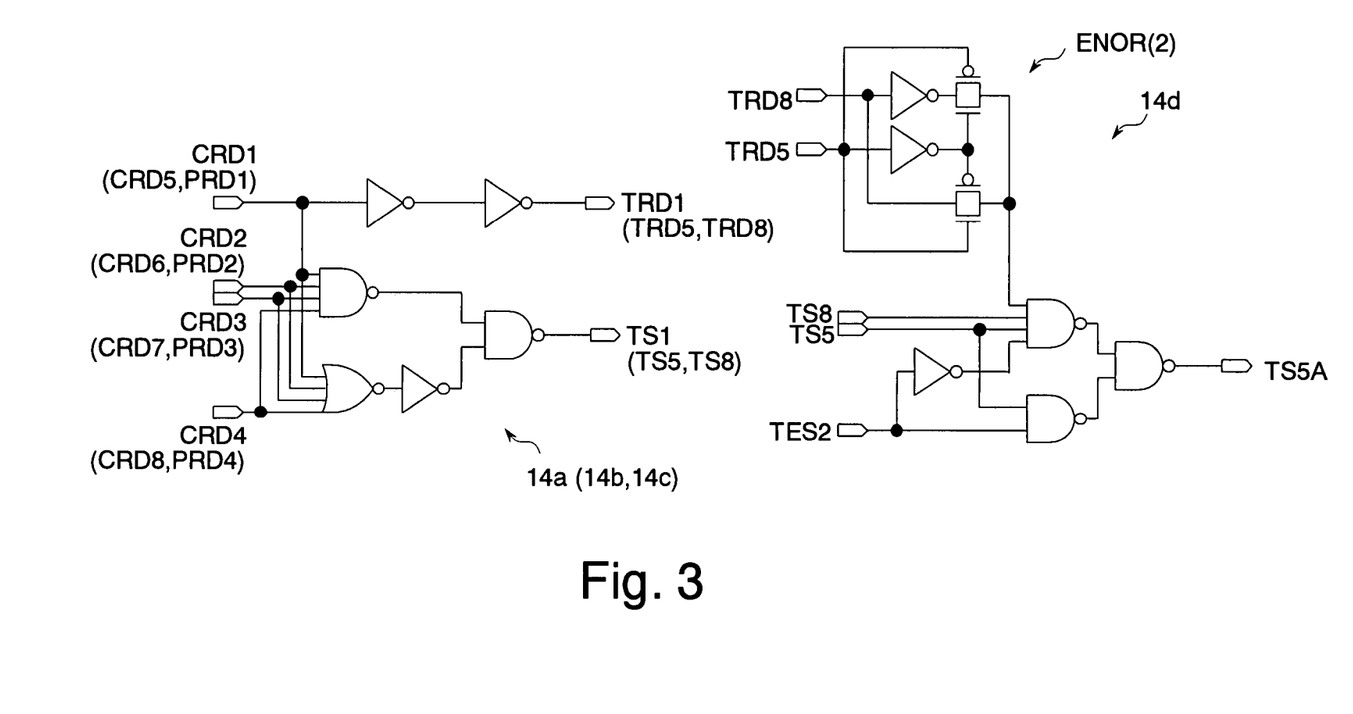
FIG. 3 is a circuit diagram showing details of coincidence detection circuits shown in FIG. 1.

FIG. 3 shows details of the coincidence detection circuits 14*a*, 14*b*, 14*c*, and 14*d* shown in FIG. 1. As described above, the coincidence detection circuits 14*a*, 14*b*, 14*c*, and 14*d* are configured with the same circuits so as to improve the design efficiency. In other words, for the memory blocks MB1-2 and PMB having four-bit data width, the coincidence detection circuits 14*a*, 14*b*, and 14*c* that have the same circuit structure can be disposed. The coincidence detection circuit 14*a* (14*b* or 14*c*) has a series of inverters, a 4-input NAND gates, a 4-input NOR gate, and a 2-input NAND gate. The series of inverters outputs the read data CRD1 (CRD5 or PRD1) as test result data TRD1 (TRD5 or TRD8). The 4-input NAND gate and 4-input NOR gate detect high levels and low levels of all the read data CRD1-4 (CRD5-8 or PRD1-4). The 2-input NAND gate outputs the test result signal TS1 (TS5 or TS8). When the logic levels of all the read data CRD1-4 (CRD5-8 or PWD1-4) are coincident with each other, namely no error occurs in the data compression test, the coincidence detection circuits 14*a*, 14*b*, and 14*c* set the test result signal TS1 (TS5 or TS8) to the high level. When one of the logic levels of the read data CRD1-4 (CRD5-8 or PWD1-4) is dissident with the others, namely an error occurs in the data compression test, the coincidence detection circuits 14*a*, 14*b*, and 14*c* set the test result signal TS1 (TS5 or TS8) to the low level. Alternatively, the test signal TES1 may be supplied to the coincidence detection circuits 14*a*, 14*b*, and 14*c* to cause the coincidence detection circuits 14*a*, 14*b*, and 14*c* to operate during only the first and second data compression test modes. In this case, since the coincidence detection circuits 14*a*, 14*b*, and 14*c* are inactivated during the normal operation mode, the power consumption can be reduced.

When the coincidence detection circuit 14*d* has a 2-input ENOR circuit, a 4-input NAND gate, a first 2-input NAND gate, a second 2-input NAND gate. The first 2-input NAND gate operates while the signal level of the test signal TES2 is the low level (during the first data compression test mode) and the high level (during the second data compression test mode). The second 2-input NAND gate outputs the test result signal TS5A. When the logic levels of the test result data TRD5 and TRD8 are coincident with each other and the signal levels of the test result signals TS5 and TS8 are the high levels during the first data compression test mode, the coincidence detection circuit 14*d* sets the test result signal TS5A to the high level. The coincidence detection circuit 14*d* outputs the test result signal TS5 as the test result signal TS5A during the second data compression test mode. In other words, the coincidence detection circuit 14*d* detects coincidence/dissidence corresponding to the outputs of the coincidence detection circuits 14*b* and 14*c* during the first data compression test mode. The coincidence detection circuit 14*d* disables the function of the coincidence detection circuit 14*c* and detects coincidence/dissidence corresponding to only the output of the coincidence detection circuit 14*b* during the second data compression test mode.

Figure 4:
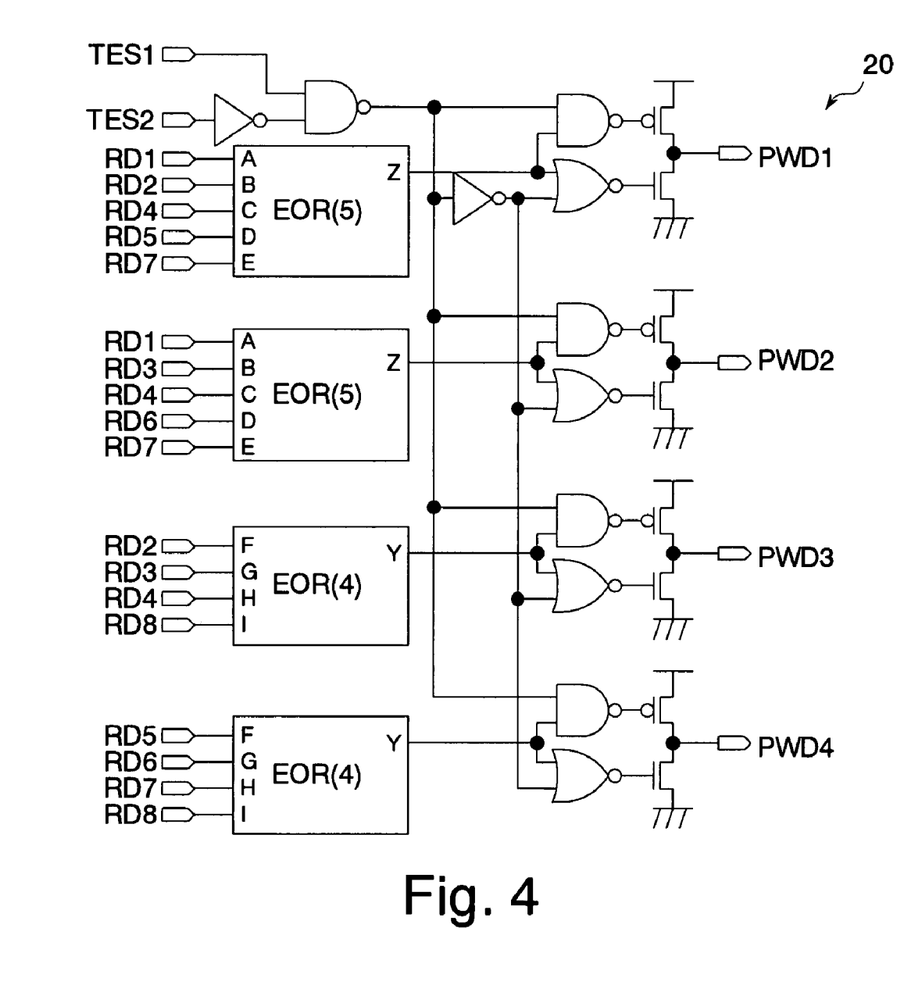
FIG. 4 is a circuit diagram showing a parity calculation circuit shown in FIG. 1.

FIG. 4 shows details of the parity operational circuit 20 shown in FIG. 1. The parity operational circuit 20 has two 5-input EOR circuits, two 4-input EOR circuits, tri-state buffer circuits that output parity write data PWD1-4, and logic gates that control the tri-state buffers. The parity operational circuit 20 operates and outputs the parity write data PWD1-4 during the normal operation mode (TES1=low level) and the second data compression test mode (TES2=high level). The parity operational circuit 20 sets the output nodes of the tri-state buffer circuits to the high impedance state during the first data compression test mode (TES1=high level, TES2=low level). In other words, the parity operational circuit 20 is deactivated. The four EOR circuits generate parity bits PWD1-4 with predetermined five bits or four bits of the read data RD1-8.

Figure 5:
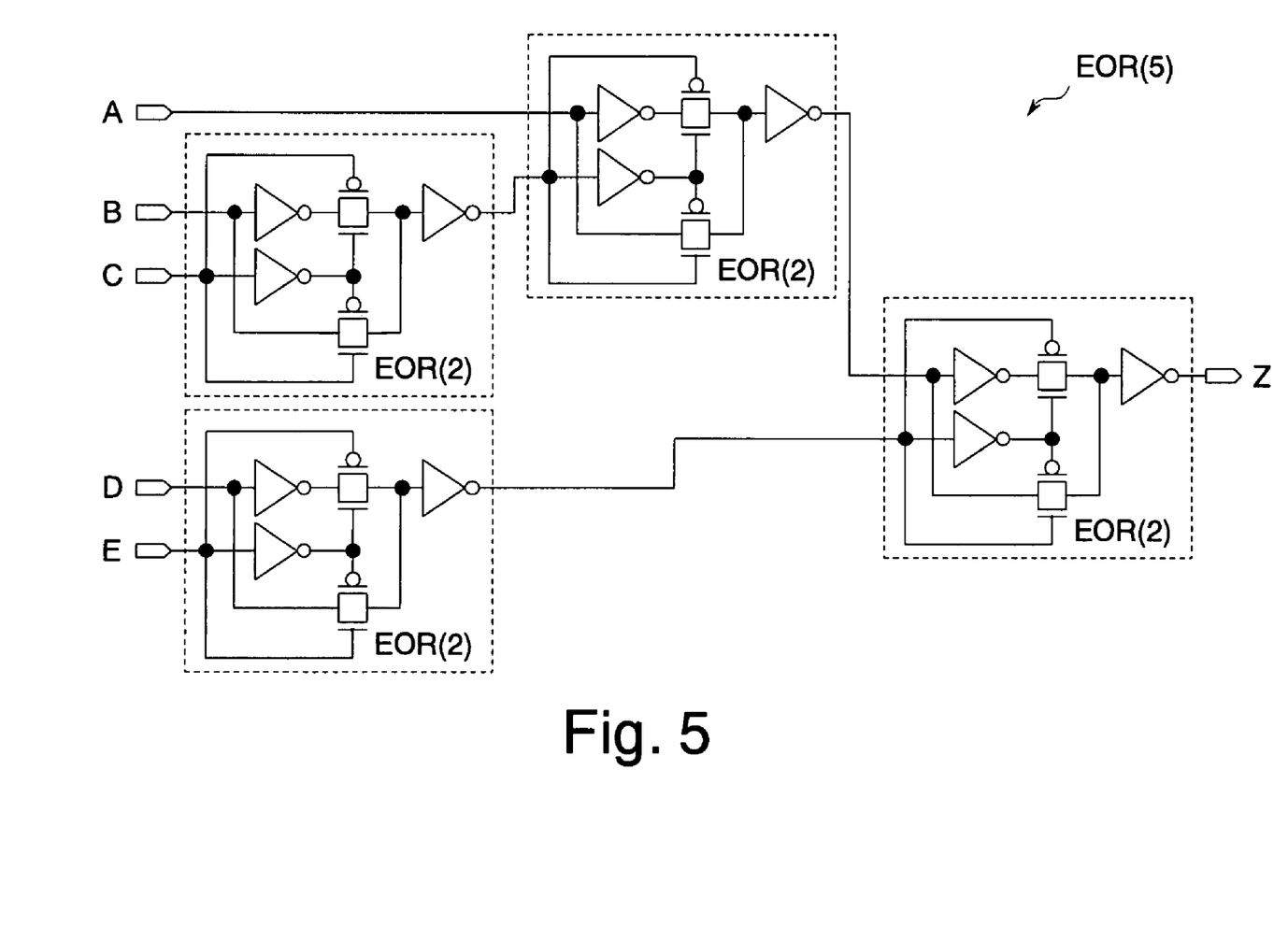
FIG. 5 is a circuit diagram showing details of a 5-input EOR circuit shown in FIG. 4.
Figure 6:
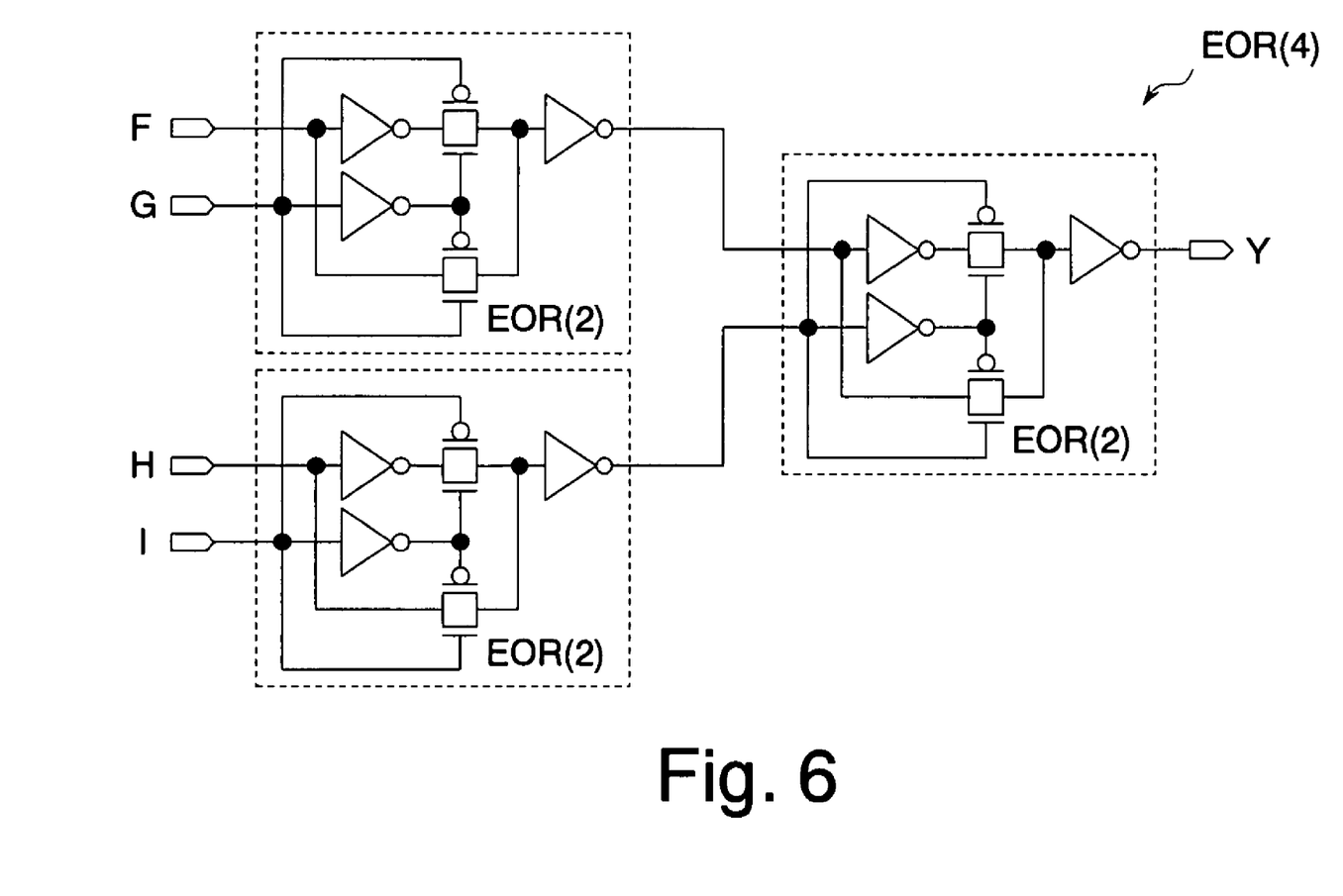
FIG. 6 is a circuit diagram showing details of a 4-input EOR circuit shown in FIG. 4.

FIG. 5 and FIG. 6 show details of the 5-input EOR circuits and the 4-input circuits shown in FIG. 4. A 5-input EOR circuit (EOR (5)) is composed of a combination of four 2-input EOR circuits. A 4-input EOR circuit (EOR (4)) is composed of a combination of three 2-input EOR circuits (EOR (2)).

Figure 7:
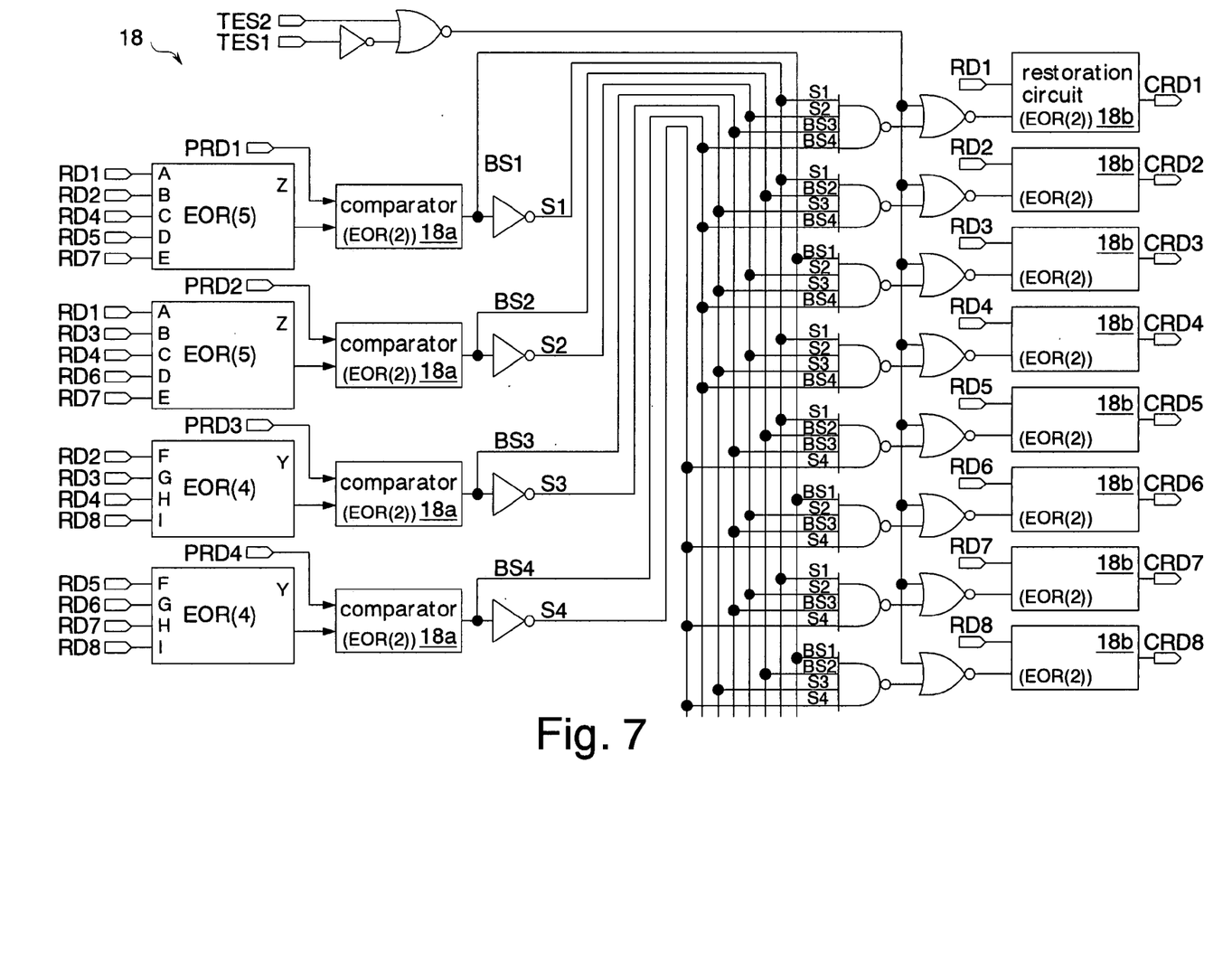
FIG. 7 is a circuit diagram showing details of a data restoration circuit shown in FIG. 1.

FIG. 7 shows details of the data restoration circuit 18 shown in FIG. 1. The data restoration circuit 18 has two 5-input EOR circuits (EOR (5)), two 4-input EOR circuits (EOR (4)), four comparison circuits 18*a* corresponding to the EOR circuits, eight restoration circuits 18*b* corresponding to bits of the correction data CRD1-8, 4-input NAND gates and 2-input NOR gates corresponding to the restoration circuits 18*b*.

The 5-input EOR circuits and the 4-input EOR circuits are the same circuits as the four EOR circuits of the parity operational circuit 20 shown in FIG. 4. Read data RD1-8 that are input to the 5-input EOR circuits and the 4-input EOR circuits are the same as those shown in FIG. 4. The comparison circuits 18*a* each are composed of a 2-input EOR circuit (EOR (2)). When the output level of the EOR circuit is the same as the logic level of the parity read data PRD1 (or PRD2-4), the comparison circuit 18*a* outputs a low level signal. When the output level of the EOR circuit is different from the logic level, the comparison circuit 18*a* outputs a high level signal. The 4-input NAND gates each receive four bits of the output signals and their inverted signals from the comparison circuits 18*a* and detect whether there is a bit error in each of the read data RD1-8. When there is a bit error, the 4-input NAND gates each outputs a low level signal. When there is no bit error, the 4-input NAND gates each output a high level signal. During the normal operation mode (TES1=low level) and the second data compression test mode (TES2=high level), the 2-input NOR gates each invert the output of the corresponding 4-input NAND gate and transfers the inverted signal to the corresponding restoration circuit 18*b*. During the first data compression test mode (TES1=high level, TES2=low level), the 2-input NOR gates each output a low level signal to the corresponding restoration circuit 18*b*.

The restoration circuits 18*b* each is composed of a 2-input EOR circuit (EOR (2)). During the normal operation mode or the second data compression test mode, the restoration circuits 18*b* each correct errors of the read data RD1-8 and output correction data CRD1-8. During the first data compression test mode, the restoration circuits 18*b* each output the read data RD1-8 as the correction data CRD1-8. During the first data compression test mode, the restoration circuits 18b function as transfer circuits that transfer the data RD1-8 that are read from the regular memory blocks MB1 and MB2, not correct errors thereof.

Figure 8:
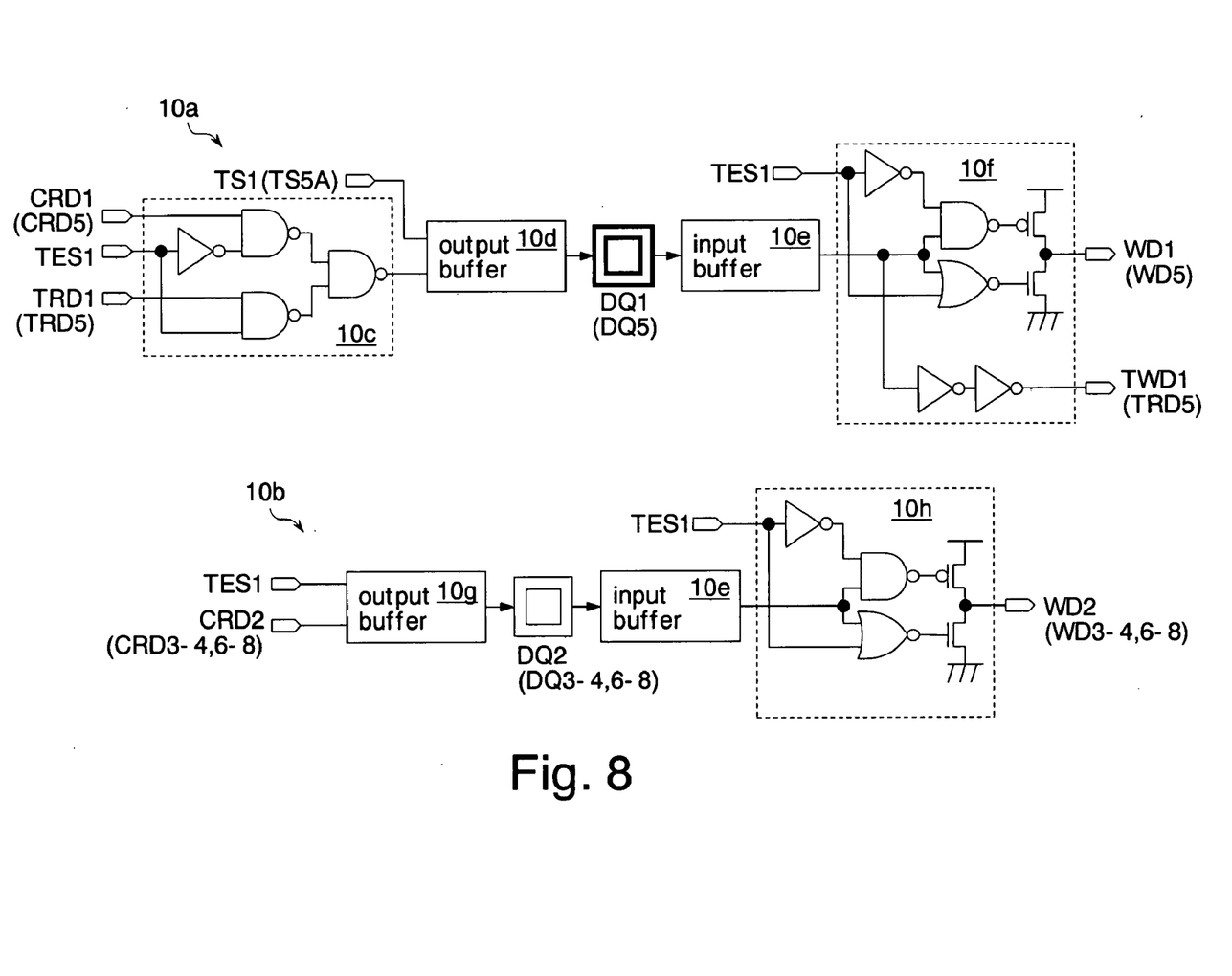
FIG. 8 is a circuit diagram showing details of I/O circuits shown in FIG. 1.

FIG. 8 shows details of the I/O circuits 10a and 10b shown in FIG. 1. The I/O circuit 10a has a logic circuit 10c, an output buffer 10d, an input buffer 10e, and a logic circuit 10f. During the normal operation mode (TES1=low level), the logic circuit 10c outputs the correction data CRD1 (or CRD5) to the output buffer 10d. On the other hand, during the first and second data compression test modes (TES1=high level), the logic circuit 10c outputs test result data TRD1 (or TRD5) to the output buffer 10d. During the normal operation mode (TES1=low level), the output buffer 10d outputs a logic level that is output from the logic circuit 10c to the external data terminal DQ. On the other hand, during the first and second data compression test modes (TES1=high level), when the signal level of the test result signal TS1 (or TS5A) is low, namely an error occurs in the data compression test, the output buffer 10d sets the output node DQ (external data terminal) to a high impedance state. During the first and second data compression test modes, when the signal level of the test result signal TS1 (or TS5) is high, namely, no error occurs in the data compression test, the output buffer 10d outputs a logic level that is output from the logic circuit 10c to the external data terminal DQ.

The input buffer 10e receives data from the external data terminal DQ1 (or DQ5) and outputs the received data to the logic circuit 10f. The logic circuit 10f has a tri-state buffer circuit and a buffer circuit. The tri-state buffer circuit supplies data to the write data line WD1 (or WD5). The buffer circuit supplies data to the test write data line TWD1 (or TWD5). During the normal operation mode (TES1=low level), the logic circuit 10f outputs data supplied from the input buffer 10e to the write data line WD1 (or WD5) through the tri-state buffer circuit. The logic circuit 10f outputs as the test write data TWD1 (or TWD5) the data supplied from the input buffer 10e through the buffer circuit during any of the test mode and the normal operation mode.

The logic circuit 10c and the output buffer 10d of the I/O circuit 10a function as data output units that output data to the data terminals DQ1 and DQ5, respectively. The logic circuit 10c functions as a selection circuit that selects the test result data TRD1 and TRD5 (detection results) that are output from the coincidence detection circuits 14a and 14d during the first and second data compression test modes and that selects the correction data CRD1 and CRD5 that are output from the data restoration circuit 18 and outputs the selected data to the data terminals DQ1 and DQ5, respectively, during the normal operation mode.

The I/O circuit 10b has an output buffer 10g, an input buffer 10e, and a logic circuit 10h. During the normal operation mode (TES1=low level), the output buffer 10g outputs correction data CRD2 (or CRD3-4 or 6-8) to the external data terminal DQ. During the first and second data compression test modes (TES1=high level), the output buffer 10g sets the output node (external data terminal) to the high impedance state. The input buffer 10e of the I/O circuit 10b is the same as the input buffer 10e of the I/O circuit 10a.

The logic circuit 10h has a tri-state buffer circuit and a control circuit. The tri-state buffer circuit supplies data to the write data line WD2 (WD3-4 or 6-8). The control circuit controls the tri-state buffer circuit. During the normal operation mode (TES1=low level), the logic circuit 10h outputs data supplied from the input buffer 10e to the write data line WD2 (WD3-4 or 6-8) through the tri-state buffer circuit. During the first and second data compression test modes (TES1=high level), the logic circuit 10h sets the output node (=WD2-4 or 6-8) of the tri-state buffer circuit to the high impedance state.

Next, the operation of the pseudo SRAM according to the first embodiment will be described in the order of the normal operation mode, the first data compression test mode, and the second data compression test mode.

During the normal operation mode, the test control circuit 16 outputs the test signals TES1 and TES2 whose signal levels are low. During the write operation of the normal operation mode, write data DQ1-8 that are input to the I/O circuits 10a and 10b are directly written to the regular memory blocks MB1-2 through the write data lines WD1-4 and 5-8. The write data WD1-8 are also supplied to the parity operational circuit 20. The parity operational circuit 20 generates four-bit parity data PWD1-4 with the write data WD1-8. The parity data PWD1-4 are written to the parity memory block PMB. The data WD1-8 and PWD1-4 are written to memory cells selected corresponding to an address signal.

During the normal operation mode, the test signal TES1 causes the output nodes of all the distribution circuits 12a, 12b, and 12c to be set to the high impedance state. In other words, the functions of the distribution circuits 12a, 12b, and 12c are disabled. Thus, the write data WD1-8 supplied from the I/O circuits 10a and 10b do not collide with the output data of the distribution circuits 12a and 12b, respectively. In addition, the parity write data PWD1-4 supplied from the parity operational circuit 20 do not collide with the output data of the distribution circuit 12c.

During the read operation of the normal operation mode, the data restoration circuit 18 restores the read data RD1-8 that are read from the regular memory blocks MB1-2 with the parity read data PRD1-4 that are read from the parity memory block PMB and outputs the restored data as the correction data CRD1-8. In other words, the functions of the data restoration circuit 18 and the parity operational circuit 20 are enabled. The logic circuit 10c of the I/O circuit 10a selects the correction data CRD1 and CRD5, not the test result data TRD1 and TRD5. In other words, the functions of the coincidence detection circuits 14b, 14c, and 14d are disabled. The I/O circuits 10a and 10b output the correction data CRD1-8 as read data to the external data terminal DQ1-8.

During the first data compression test mode, the test control circuit 16 outputs the test signal TES1 whose signal level is high and the test signal TES2 whose signal level is low. During the write operation of the first data compression test mode, the test signal TES1 causes the distribution circuits 12a, 12b, and 12c to be activated (enabled). The common test data TWD1 are written to the regular memory block MB1. The common test data TWD5 are written to the regular memory block MB2 and the parity memory block PMB. In other words, compression data are also written to the parity memory block PMB. At this point, since the parity operational circuit 20 is inactivated (disabled), the test data TWD5 does not collide with the parity write data.

As described above, during the first compression test mode, test data (compression data) of one bit received at the external data terminal DQ1 are divided into four bits. Test data (compression data) of one bit received at the external data terminal DQ5 are divided into eight bits. In other words, the compression rate (=4) of test data received at the external data terminal DQ1 is different from the compression rate (=8) of test data received at the external data terminal DQ5. Since the compression rates are different, when a data compression test function is added to a semiconductor memory that has a parity memory block PMB, the number of external data terminals DQ used in a compression test does not increase. Thus, the number of pseudo SRAMs that can be tested in a test apparatus such as an LSI tester can be prevented from decreasing. As a result, the test time for the semiconductor memory can be decreased and the test cost thereof can be prevented from increasing.

During the read operation of the first data compression test mode, the data restoration circuit 18 outputs the read data RD1-8 that are read from the regular memory blocks MB1-2 as the correction data CRD1-8 to the coincidence detection circuits 14a and 14b, not corrects errors of the read data RD1-8. In other words, during the first data compression test mode, the data restoration circuit 18 disables the data restoration function. The coincidence detection circuits 14a and 14b detect coincidence/dissidence of the correction data CRD1-4 and CRD5-8 (compression data) and output the test result signals TS1 and TS5 and the test result data TRD1 and TRD5. The coincidence detection circuit 14c detects coincidence/dissidence of the parity read data PRD1-4 (compression data) and outputs the test result signal TS8 and the test result data TRD8.

The coincidence detection circuit 14d detects coincidence/dissidence of the test result data TRD5 and TRD8 and the levels of the test result signals TS5 and TS8 and outputs the test result signal TS5A. Thus, during the first data compression test mode, the functions of all the coincidence detection circuits 14a, 14b, 14c, and 14d are enabled. When the correction data CRD5-8 and the parity read data PRD1-4 are the same values, the signal level of the test result signal TS5A changes to the high level that indicates that no error occurs. When the signal level of the test result signal TS1 or TS5A is high (no error occurs), the two I/O circuits 10a output the test result data TRD1 or TRD5 to the external data terminal DQ1 or DQ5, respectively. The test result data TRD1 and TRD5 have the same logic values as the test data written to the memory blocks MB1-2 and PMB.

When the signal level of the test result signal TS1 or TS5A is low (an error occurs), the I/O circuit 10a sets the external data terminal DQ1 or DQ5 to the high impedance state. The test apparatus that tests the pseudo SRAM sets the external data terminals DQ1 and DQ5 to an intermediate voltage of the power supply voltage and the ground voltage with a termination resistor or the like. During the read operation of the first data compression test mode, when the test apparatus detects the intermediate voltage at the external data terminal DQ1 or DQ5, the test apparatus detects an error of the memory block MB1, the memory block MB2, or PMB. When the first data compression test result indicates that the first regular memory block MB1 has an error, it is corrected by the redundancy circuit RED of the first regular memory block MB1. The test result indicates that one of the memory block MB2 and PMB has an error, it is corrected by the redundancy circuits RED of the memory block MB2 and PMB.

During the second data compression test mode, the test control circuit 16 outputs the test signals TES1 and TES2 whose signal levels are high. During the write operation of the second data compression test mode, the distribution circuits 12a and 12b are activated (enabled) and the test data TWD1 and TWD5 are written to the regular memory blocks MB1-2. In addition, the parity operational circuit 20 is activated (enabled). Thus, the parity operational circuit 20 generates the parity data PWD1-4 of the write data WD1-4 (=TWD1) and WD5-8 (=TWD5). The parity data PWD1-4 are written to the parity memory block PMB. The distribution circuit 12c is deactivated (disabled) so as to prevent the parity data PWD1-4 from colliding with the output of the parity operational circuit 20.

During the read operation of the second data compression test mode, the data restoration circuit 18 is activated (enabled). Like the read operation of the normal operation mode, the data restoration circuit 18 restores the read data RD1-8 that are read from the memory blocks MB1-2 with the parity read data RD1-4 that are read from the parity memory block PMB and generates the correction data CRD1-8. Thereafter, the same operation as the read operation of the first data compression test mode is performed except that the coincidence detection circuit 14d disables the output of the coincidence detection circuit 14c and enables the output of the coincidence detection circuit 14b. In other words, when all the correction data CRD1-4 are coincident with each other, the test result data TRD1 that are the same value as the correction data CRD1-4 are output to the external data terminal DQ1. When the correction data CRD1-4 are not coincident with each other, the external data terminal DQ1 is set to the high impedance state. When all the correction data CRD5-8 are coincident with each other, the test result data TRD5 that have the same value as the correction data CRD5-8 are output to the external data terminal DQ5. When the correction data CRD5-8 are not coincident with each other, the external data terminal DQ5 is set to the high impedance state.

The foregoing first data compression test and second data compression test are used for different purposes as follows. If there is a possibility of which the characteristics of the pseudo SRAM vary and a defect thereof occurs after shipment, the first data compression test is performed. As an example of which characteristics of the pseudo SRAM vary, the refresh time tREF that indicates refresh intervals of memory cells may decrease when the pseudo SRAM is developed by a new semiconductor technology. In the first data compression test, a pseudo SRAM chip is tested without the error correction function using parity bits. In other words, the error correction function is not used to correct an error. Thus, if a bit error or the like occurs in a pseudo SRAM that has been shipped, the error can be corrected with the error correction function. As a result, the reliability of the pseudo SRAM can be improved.

In contrast, if it is obvious that the characteristics of a pseudo SRAM will not vary after shipment, the second data compression test is performed. As an example of which the characteristics of a pseudo SRAM will not vary, a sufficient number of pseudo SRAMs have been shipped for a long time and the defect rate of the pseudo SRAMs after shipment is very low. In the second data compression test, a pseudo SRAM chip is tested with the error correction function using parity bits. When a pseudo SRAM is tested with the error correction function, the yield as a good product rate can be increased. Since the same test terminals DQ1 and DQ5 are used in any of the first and second data compression tests, a common test evaluation board can be used in the first and second data compression tests. As a result, the test cost of the pseudo SRAM can be decreased.

Thus, in the pseudo SRAM that has the parity memory block PMB that can correct an error, the data compression test is performed by selectably enabling or disabling the error correction function. Thus, the data compression test can be optimally performed depending on product conditions and shipment conditions of the pseudo SRAM.

In the embodiment, since the number of bits (data compression rate) of the test write data TWD5 to be distributed depends on whether the first data compression test mode or the second data compression test mode is performed, the data compression test function for the parity memory block PMB can be accomplished without need to increase the number of test terminals. Since the number of test terminals does not increase, the number of pseudo SRAMs mounted on the test evaluation board is not decreased. As a result, the number of pseudo SRAMs that can be tested per unit time can be prevented from decreasing. In other words, the test time of the pseudo SRAM can be decreased and the test cost thereof can be decreased.

In the second data compression test, the error correction function is enabled. Thus, even if there are bit errors or the like in the regular memory blocks MB1 and MB2, the error correction function allows the errors to be corrected. As a result, the yield of the pseudo SRAM can be improved.

In the first and second data compression tests, the number of pseudo SRAMs that can be tested at a time does not vary. Thus, the first and second data compression tests can be performed with a common test evaluation board. As a result, the test cost of the pseudo SRAM can be further decreased.

The distribution circuits 12a, 12b, and 12c are disposed corresponding to the memory blocks MB1, MB2, and PMB, respectively. Thus, the output destinations of the test write data TWD1 and TWD5 can be easily and securely selected corresponding to a test mode. In particular, the distribution circuit 12b is activated during the first and second data compression test modes. In contrast, the distribution circuit 12c is activated during only the first data compression test mode. Since the distribution circuits 12b and 12c that differently operate corresponding to test modes are independently disposed, the circuits 12b and 12c can be easily controlled. In other words, the circuit design and timing design of the pseudo SRAM can be easily performed.

The coincidence detection circuits 14a, 14b, and 14c are disposed corresponding to the memory blocks MB1, MB2, and PMB having the same bit width, respectively. The coincidence detection circuit 14d detects coincidence/dissidence of the read data RD5-8 that are read from the regular memory block MB2 and the parity read data PRD1-4 that are read from the parity memory block PMB. Since the coincidence detection circuits 14b, 14c, and 14d are hierarchically configured, the coincidence detection circuits 14a, 14b, and 14c can be composed of the same circuits. Thus, the circuit design and timing design of the pseudo SRAM can be easily performed.

The data restoration circuit 18 has a transfer function that transfers the data RD1-8 that are read from the regular memory blocks MB1-2 to the coincidence detection circuits 14a and 14b during the first data compression test mode. Thus, the transfer paths for the data RD1-8 that are read from the regular memory blocks MB1-2 during the first and second data compression tests can be the same. As a result, the number of wiring lines formed in the pseudo SRAM can be decreased and thereby the chip size thereof can be decreased.

The logic circuit 10c of the I/O circuit 10a selects the test result data TRD1 or TRD5 during the first and second data compression test modes. The logic circuit 10c selects the correction data CRD1 and CRD5 during the normal operation mode. Thus, the coincidence detection circuits 14a, 14b, 14c, and 14d can be always operated in any of the test modes and the normal operation mode. Since the functions of the coincidence detection circuits 14a, 14b, 14c, and 14d can be enabled or disabled by the logic circuit 10c, these circuits 14a, 14b, 14c, and 14d can be simply configured.

The functions of the distribution circuits 12a, 12b, and 12c and the coincidence detection circuits 14a, 14b, and 14c are disabled during the normal operation mode. The functions of the parity operational circuit 20 and the data restoration circuit 18 are enabled during the normal operation mode. Thus, the error correction function can be enabled during the normal operation mode and thereby an error that occurs in the memory that is operating can be corrected.

Figure 9:
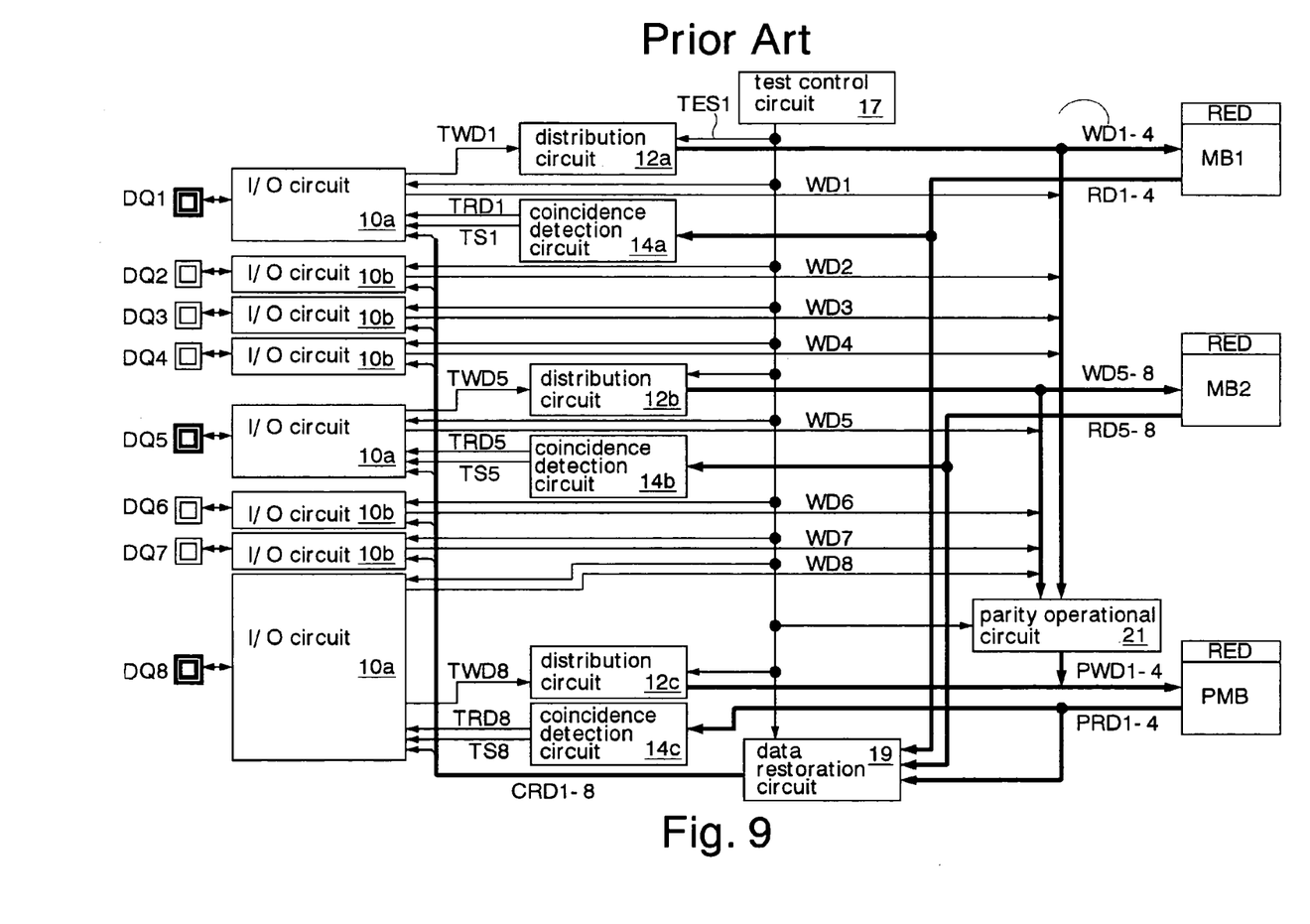
FIG. 9 is a block diagram showing a pseudo SRAM that the inventors of the present invention studied before they made the present invention.

FIG. 9 shows a pseudo SRAM that the inventors studied before they made the present invention. In FIG. 9, the same elements as those in the first embodiment are denoted by the same reference numerals and their detailed description will be omitted. The pseudo SRAM does not have a data compression test function that performs an error correction function (this data compression test function is equivalent to the second data compression test of the first embodiment). Thus, this pseudo SRAM has only the normal operation mode and the first data compression test mode as operation modes. To identify the operation modes, a test control circuit 17 outputs only a test signal TES1. Since a parity operational circuit 21 operates during only the normal operation mode, the test control circuit 21 operates while it is receiving the test signal TES1 whose signal level is low.

As a test terminal with which a data compression test is performed for a parity memory block PMB, a data terminal DQ8 is allocated. In other words, data terminals DQ1, DQ5, and DQ8 are allocated to memory blocks MB1-2 and PMB, respectively. It is not necessary to determine coincidence/dissidence of test result signals TRD5 and TRD8 of the regular memory block MB2 and the parity memory block PMB. Thus, the coincidence detection circuit 14d of the first embodiment is not disposed.

Figure 10:
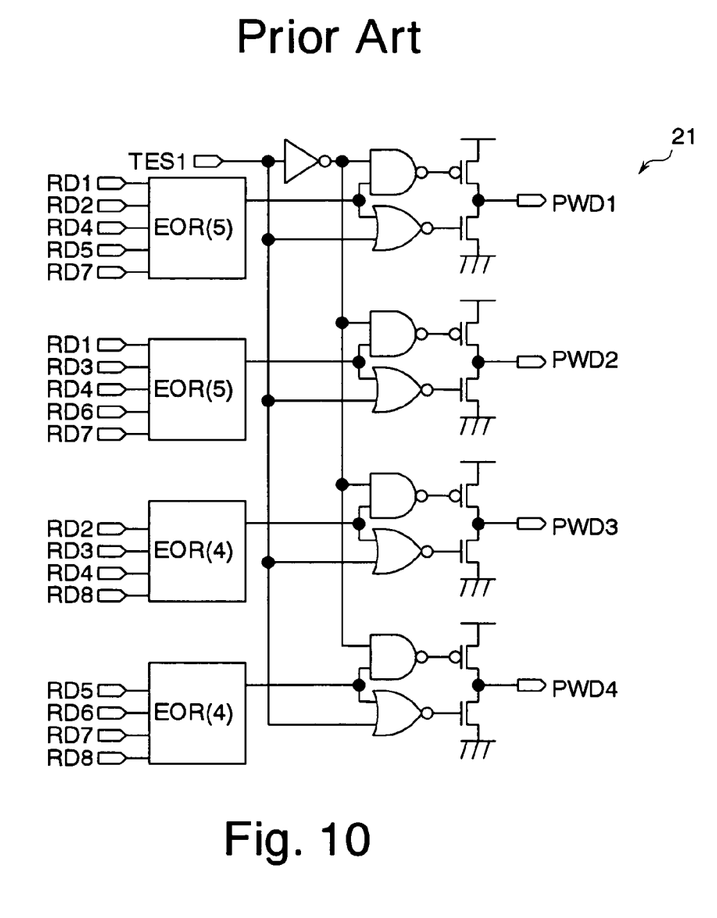
FIG. 10 is a circuit diagram showing details of a parity operational circuit shown in FIG. 9.

FIG. 10 shows details of the parity operational circuit 21 shown in FIG. 9. The parity operational circuit 21 is different from the parity operational circuit 20 of the first embodiment in that while the parity operational circuit 21 is receiving the test signal TES1 whose signal level is high, the parity operational circuit 21 sets its output to the high impedance state.

Figure 11:
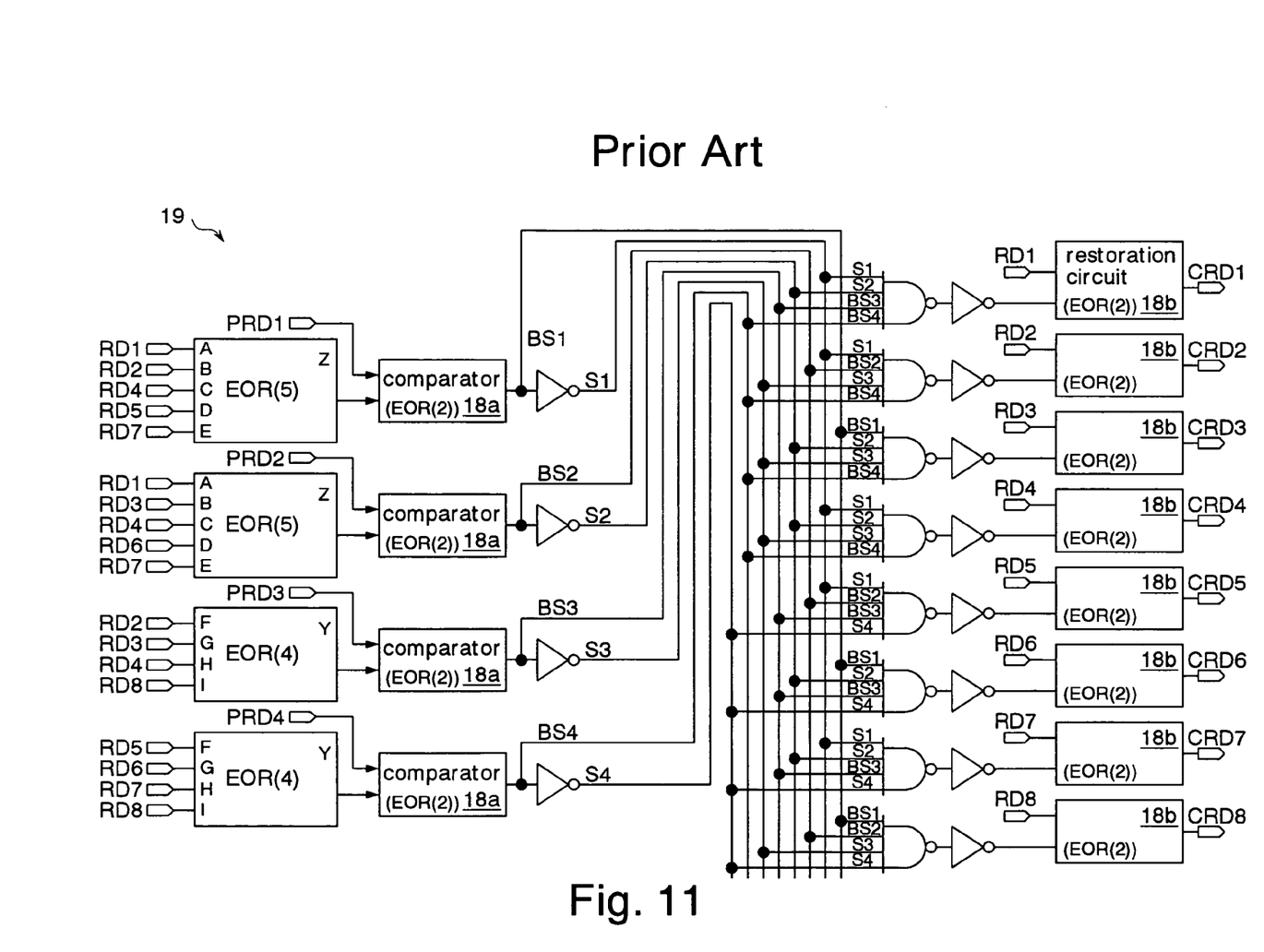
FIG. 11 is a circuit diagram showing details of a data restoration circuit shown in FIG. 9.

FIG. 11 shows details of a data restoration circuit 19 shown in FIG. 9. The data restoration circuit 19 is different from the data restoration circuit 18 of the first embodiment in that the data restoration circuit 18 operates in any of the operation modes. The data restoration circuit 19 may not operate during the first data compression test mode that disables the error correction function. In this example, the restoration function of the data restoration circuit 19 is disabled by an I/O circuit 10a during the first data compression test mode.

The circuits studied in FIG. 9 to FIG. 11 have a problem of which the number of test terminals necessary for a data compression test is large. In the data compression test, the error correction function is disabled. Thus, when the pseudo SRAM is tested while the error correction function is enabled, read and write tests should be performed in the normal operation mode. As a result, the test time of the pseudo SRAM remarkably increases. In contrast, according to the present invention, all these problems can be solved.

The foregoing embodiment describes an example of which the present invention is applied to a pseudo SRAM. However, it should be noted that the present invention is not limited to the embodiment. In other words, when the present invention is applied to other semiconductor memories such as a DRAM, an SRAM, and a ferroelectric memory, the same effect as the foregoing embodiment can be obtained.

The invention is not limited to the above embodiments and various modifications may be made without departing from the spirit and scope of the invention. Any improvement may be made in part or all of the components.

What is claimed is:

1. A semiconductor memory, comprising:
   a first regular memory block to which write data of a plurality of bits are written, said write data being received by a first data terminal group including a first data terminal;
   a second regular memory block to which write data of a plurality of bits are written, said write data being received by a second data terminal group including a second data terminal;
   a parity operational unit which generates parity data of a plurality of bits corresponding to said write data of at least one of the first and second regular memory blocks;
   a parity memory block to which said parity data are written;
   a first distribution unit which outputs first test data supplied to said first data terminal as common write data to said first regular memory block;
   a second distribution unit which outputs second test data supplied to said second data terminal as common write data to said second regular memory block and said parity memory block;
   a data restoration unit which corrects an error of data of a plurality of bits which are read from said first and second regular memory blocks with parity data of a plurality of bits which are read from said parity memory block and outputs the resultant data as correction data of a plurality of bits;
   a first coincidence detection unit which detects coincidence or dissidence of data of a plurality of bits which are read from said first regular memory block;
   a second coincidence detection unit which detects coincidence or dissidence of data of a plurality of bits which are read from said second regular memory block and said parity memory block; and
   a test control unit which
   enables functions of said first and second distribution units and said first and second coincidence detection units and disables functions of said parity operational unit and said data restoration unit during a first data compression test mode which disables an error correction function, and
   enables functions of said first distribution unit, said first coincidence detection unit, said parity operational unit, and said data restoration unit, a first output function which outputs said second test data to said second regular memory block, said first output function being included in said second distribution unit, and a first detection function which detects coincidence or dissidence of correction data which are output from said data restoration unit, said first detection function being included in said second coincidence detection unit, and disables a second output function which outputs said second test data to said parity memory block, said second output function being included in said second distribution unit, and a second detection function which detects coincidence or dissidence of parity data which are read from said parity memory block, said second detection function being included in said second coincidence detection unit, during a second data compression test mode which enables the error correction function.

2. The semiconductor memory as set forth in claim 1, wherein
   said second distribution unit includes:
   a first distribution circuit which outputs said second test data to said second regular memory block; and
   a second distribution circuit which outputs said second test data to said parity memory block, and wherein
   said test control unit enables said first distribution circuit and disables said second distribution circuit during said second data compression test mode.

3. The semiconductor memory as set forth in claim 1, wherein
   said second coincidence detection unit includes:
   a first coincidence detection circuit which detects coincidence or dissidence of data of a plurality of bits which are read from said second regular memory block;
   a second coincidence detection circuit which detects coincidence or dissidence of parity data of a plurality of bits which are read from said parity memory block; and
   a third coincidence detection circuit which detects coincidence or dissidence of data which are read from said second regular memory block and parity data which are read from said parity memory block in accordance with detection results of said first and second coincidence detection circuits, and wherein
   said test control unit enables said first and third coincidence detection circuits and disables said second coincidence detection circuit during said second data compression test mode, and
   said third coincidence detection circuit detects coincidence or dissidence in accordance with outputs of said first and second coincidence detection circuits during said first data compression test mode, and detects coincidence or dissidence in accordance with only an output of said first coincidence detection circuit during said second data compression test mode.

4. The semiconductor memory as set forth in claim 3, wherein
   the bit width of data which are read from and written to said first and second regular memory blocks is the same as that of said parity memory block.

5. The semiconductor memory as set forth in claim 1, wherein
   said data restoration unit has a transfer circuit which transfers data which are read from said first and second regular memory blocks to said first and second coincidence detection units without restoring said data, during said first data compression test mode.

6. The semiconductor memory as set forth in claim 1, further comprising:
   data output units which output data to said first and second data terminals, respectively, wherein
   said data output units each have a selection circuit which selects detection results which are output from said first and second coincidence detection units during said first and second data compression test modes, and
   selects correction data which are output from said data restoration unit during a normal operation mode in which data are read from and written to said first and second regular memory blocks using said first and second terminal groups.

7. The semiconductor memory as set forth in claim 1, wherein
   said test control unit disables functions of said first and second distribution units and said first and second coincidence detection units and enables functions of said parity operational unit and said data restoration unit during a normal operation mode in which data are read from and written to said first and second regular memory blocks using said first and second data terminal groups.

* * * * *